(12) United States Patent
Mizuochi et al.

(10) Patent No.: US 9,502,208 B2
(45) Date of Patent: Nov. 22, 2016

(54) CHARGED PARTICLE BEAM APPARATUS, STAGE CONTROLLING METHOD, AND STAGE SYSTEM

(71) Applicant: Hitachi High-Technologies Corporation, Minato-ku, Tokyo (JP)

(72) Inventors: Masaki Mizuochi, Tokyo (JP); Akira Nishioka, Tokyo (JP); Shuichi Nakagawa, Tokyo (JP); Hironori Ogawa, Tokyo (JP)

(73) Assignee: Hitachi High-Technologies Corporation, Tokyo (JP)

( * ) Notice: Subject to any disclaimer, the term of this patent is extended or adjusted under 35 U.S.C. 154(b) by 0 days.

(21) Appl. No.: 14/747,364

(22) Filed: Jun. 23, 2015

(65) Prior Publication Data

US 2016/0005568 A1   Jan. 7, 2016

(30) Foreign Application Priority Data

Jul. 7, 2014   (JP) .................................. 2014-139283

(51) Int. Cl.
*H01J 37/00*   (2006.01)
*H01J 37/20*   (2006.01)

(52) U.S. Cl.
CPC ...... *H01J 37/20* (2013.01); *H01J 2237/20221* (2013.01); *H01J 2237/20278* (2013.01)

(58) Field of Classification Search
CPC .. H01J 37/20; H01J 37/22; H01J 2237/2602; H01J 2237/20278
USPC ....... 250/306, 307, 310, 311, 440.11, 442.22
See application file for complete search history.

(56) References Cited

U.S. PATENT DOCUMENTS

| | | | | |
|---|---|---|---|---|
| 2009/0251091 | A1* | 10/2009 | Fujita ..................... | H01J 37/20 318/594 |
| 2013/0056636 | A1* | 3/2013 | Haneda ................... | H01J 37/20 250/310 |
| 2014/0001373 | A1* | 1/2014 | Knappich ............... | H01J 37/20 250/397 |

FOREIGN PATENT DOCUMENTS

| | | |
|---|---|---|
| JP | 2003-309062 A | 10/2003 |
| JP | 2004-111684 A | 4/2004 |

\* cited by examiner

*Primary Examiner* — Michael Maskell
(74) *Attorney, Agent, or Firm* — Crowell & Moring LLP

(57) ABSTRACT

A stage system includes a stage that holds an object, a linear motor mechanism that moves the stage by a thrust force generated by a current flowing through the coil, and a control section that controls the current flowing through the coil. The current flowing through the coil in a state where the stage is maintained in the static state be greater than a minimum current amount required for generating the thrust force greater than a maximum static friction force of the stage with respect to the guide rails.

18 Claims, 22 Drawing Sheets

CHARGED PARTICLE BEAM APPARATUS, STAGE CONTROLLING METHOD, AND STAGE SYSTEM

BACKGROUND OF THE INVENTION

The present invention relates to a stage control method for holding an object and a stage system using the stage control method. Particularly, the invention relates to a charged particle beam apparatus such as an electron microscope, an ion beam machining/observation apparatus, and the like.

In recent years, integration of semiconductor products has been improved more and more and higher definition of a circuit pattern thereof has been required. Various inspection means for the purpose of quality control and a yield increase have been used in a sample such as a wafer on which the circuit pattern is formed. For example, there is a SEM type inspection apparatus using an optical type inspection apparatus or a scanning type electron microscope (SEM) for inspecting foreign matters or defects of the wafer by applying light. Furthermore, a scanning type electron microscope (hereinafter, referred to as a length measurement SEM) for measuring a dimensional accuracy of the circuit pattern by applying a charged particle beam, a scanning type electron microscope (hereinafter, referred to as a review SEM) for evaluating the defects or the foreign matters by applying the charged particle beam and imaging defects of the circuit pattern or adhered foreign matters at a high magnification, and the like are also used. These apparatuses are collectively referred to as an inspection apparatus.

A stage used in such an inspection apparatus has a general configuration in which an X guide rail is attached to a base to guide an X table in an X-direction, the X table is mounted on the X guide rail, a Y table capable of moving in a Y-direction is further mounted on the X table, and a chuck holding a sample is mounted within a vacuum chamber. In such a stage, in the related art, a combination of a ball screw and a rotary motor is used as an actuator that is a driving source, but in recent years, a case where a linear motor of which a structure is simple and maintenance is also easy is used has been increased.

In order to continuously observe a plurality of positions of the wafer, it is necessary to move the stage and perform positioning of the wafer. In this case, if running of the stage is continued, a temperature of the stage is changed by heat generation of the linear motor. If the temperature of the stage is changed, a positioning accuracy of a position of the stage is degraded due to deformation, expansion, and the like of the table. Furthermore, if a difference in the temperature between the stage and the wafer that is transported is great, defects that a pattern cannot be positioned in a desired position may occur due to thermal expansion of the wafer during the observation.

Regarding such a problem described above, an exposure apparatus in which "heat is generated in a motor bypassing at least a current to the motor smaller than an excitation current required for driving the motor after a stage is stopped, and thereby a temperature is controlled in a state where a stage 11 is neither heated nor cooled" is disclosed in JP-A-2004-111684.

An electron beam drawing apparatus in which "a sample stage is operated during a certain period of time until a temperature of the sample stage becomes a set reference temperature or more", that is, the stage is moved and is idling during a period of non-operation of the apparatus to prevent a decrease in a temperature in a state of the non-operation of the apparatus is disclosed in JP-A-2003-309062.

SUMMARY OF INVENTION

However, in a case of a method disclosed in JP-A-2004-111684, a current amount cannot be adjusted only in a range enough to keep a static state of the stage, that is, in a range in which a driving force of the stage does not exceed a static friction force. Of course, in general, a current amount when the stage is driven is much greater than a current amount when the stage is in the static state. A heat amount is determined by the current amount and a voltage. In this method, the current amount cannot be sufficiently increased, and heat generation when the stage is operated and heat generation when the stage stops may not be able to be the same extent.

Thus, as described in JP-A-2003-309062, it is conceivable that the stage is idling when the apparatus is not running and a temperature while the stage being driven is maintained. However, in this method, since the stage is operated in addition to an operation time required for original observation or inspection, a service life of a guide of the stage, a bending wiring, and the like becomes shorter.

An object of the invention is to provide an apparatus in which a temperature change between a driving state and a static state of the apparatus is reduced and a positioning accuracy of a sample is improved without affecting a service life of the apparatus.

In order to solve the problems described above, the present invention provides a stage system including: a stage that holds an object; a linear motor mechanism that moves the stage by a thrust force generated by a current flowing through the coil; and a control section that controls the current flowing through the coil. The current flowing through the coil in a state where the stage is maintained in the static state be greater than a minimum current amount required for generating the thrust force greater than a maximum static friction force of the stage with respect to the guide rails.

According to the invention, it is possible to reduce the temperature change between the driving state and the static state of the apparatus without affecting a service life of the apparatus. Thus, the positioning accuracy of the sample can be improved. Objects, configurations, and effects other than the above description will become apparent from the following descriptions of embodiments.

DESCRIPTION OF THE EMBODIMENTS

Hereinafter, an example of a charged particle beam apparatus using a scanning type electron microscope is described as an example of an inspection apparatus, but this is merely one example of the invention. The invention is not limited to the embodiments described below and may be an apparatus which uses light. In addition, the charged particle beam apparatus in the invention is intended to broadly include an apparatus for imaging an image of a sample using a charged particle beam. As an example of the charged particle beam apparatus, an inspection apparatus, a review apparatus, and a pattern measuring apparatus using the scanning type electron microscope are exemplified. Furthermore, the charged particle beam apparatus can be also applied to a sample machining apparatus or a sample analyzing apparatus including a general purpose scanning type electron microscope or a scanning type electron microscope. Furthermore, the following charged particle beam apparatus also includes a system to which the charged particle beam apparatus described above is connected via a network or a combined apparatus of the charged particle beam apparatus described above. In the following examples, an example in which the invention is applied to a review SEM is described as an example of the charged particle beam apparatus.

In this specification, "defect" is not limited to a defect of a pattern and broadly includes observation objects such as foreign matters, pattern size abnormalities, and a structure failure.

In this specification, "sample" broadly includes inspection or observation of objects. In the following description, as an example, a semiconductor wafer (hereinafter, referred to as wafer) is described.

Hereinafter, examples of the invention will be described in detail with reference to the drawings.

First Example

Figure 1:
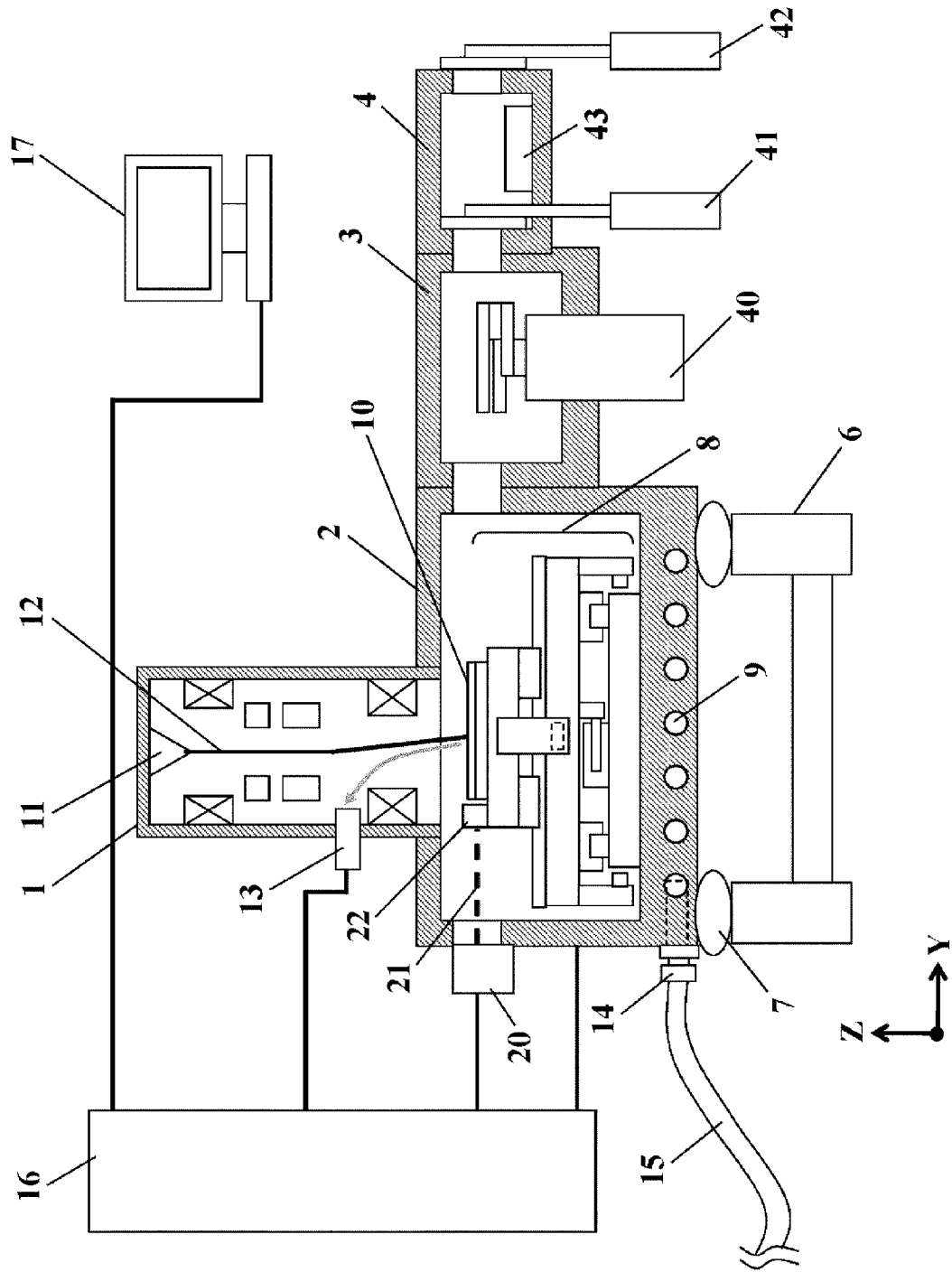
FIG. 1 is a schematic side view of a body of an inspection apparatus.

FIG. 1 schematically illustrates an entirety of an inspection apparatus of the example.

Mounts 7 for damping vibration of a floor are installed on a pedestal 6 provided on the floor and the mounts 7 support a sample chamber 2 that is a vacuum vessel. A column 1 that controls an electron beam 12 to be generated and to scan the sample is installed in an upper portion of the sample chamber 2. The column 1 includes a deflector that deflects the electron beam 12 so as to scan the sample or an objective lens that converges on the electron beam 12 on the sample in addition to an electron source 11 generating the electron beam 12. In addition, the column may include other various lens or apertures and a configuration of a charged particle optical system is not limited to the examples. In addition, the column 1 is provided with a detector 13 for detecting secondary charged particles such as secondary electrons or reflective electrons obtained by applying the electron beams to the sample.

The sample chamber 2 includes a stage 8 for holding and moving the sample and the stage 8 is capable of being driven in a horizontal plane (XY plane). A detailed description of the stage 8 is described below with reference to FIGS. 2 and 3.

A transportation chamber 3 in which a transportation robot 40 for transporting the wafer between a preliminary exhaust chamber 4 and the sample chamber 2 is included is installed on the side of the sample chamber 2. Furthermore, the preliminary exhaust chamber 4 is installed on the side of the transportation chamber 3. The sample chamber 2 is constantly evacuated by a vacuum pump (not illustrated) and an inside of the column 1 is also kept at a high vacuum state by a high vacuum pump (ion pump and the like) (not illustrated). On the other hand, an atmosphere-side gate valve 42 for isolating the preliminary exhaust chamber 4 from the atmosphere and a vacuum-side gate valve 41 for isolating the preliminary exhaust chamber 4 from the sample chamber 2 are installed in the preliminary exhaust chamber 4. A wafer stand 43 is included on the inside of the preliminary exhaust chamber 4.

Here, a transportation path of the wafer will be simply described.

The atmosphere-side gate valve 42 is opened and a wafer 10 is introduced from the atmosphere side to the wafer stand 43 on the inside of the preliminary exhaust chamber 4 by a transportation robot (not illustrated). Next, the atmosphere-side gate valve 42 is closed and the inside of the preliminary exhaust chamber 4 is evacuated by a vacuum pump (not illustrated). After a degree of vacuum of the preliminary exhaust chamber 4 becomes approximately the same as that of the inside of the sample chamber 2, the vacuum-side gate valve 41 is opened and the wafer 10 is transported on the stage 8 included in the sample chamber by the robot 40. The wafer 10 is disposed on an electrostatic chuck 23 of the stage 8 and electrostatic adsorption is performed.

A position of the wafer 10 transported on the stage 8 is managed by measuring a position of the stage by a laser interferometer 20. The stage is positioned in coordinates to be observed and a signal of a secondary charged particles obtained by scanning the electron beam is detected by the detector 13. An image is generated by performing a calculation in an image processing section included in a control system 16 based on the signal and scanning information. The image may be displayed as a SEM image on a monitor 17 or may be stored in a storage device such as a hard disk (not illustrated).

In the inspection apparatus of the example, a control system for controlling an operation of each portion or a power supply (not illustrated) is included in addition to the above configuration. The control system described above or an image generation section may be configured as hardware by a dedicated circuit substrate or may be configured as software that is executed by a computer connected to the inspection apparatus. If the inspection apparatus is configured by the hardware, the inspection apparatus is realized by integrating a plurality of calculators executing the process on a wiring substrate, in a semiconductor chip, or in a package. If the inspection apparatus is configured by the software, the inspection apparatus is realized by executing a program executing a desired calculation process by mounting a general purpose high-speed CPU on the computer. An existing apparatus may be upgraded by a recording medium in which the program is stored. Furthermore, the apparatus, the circuit, and the computer are connected via a wired or wireless network, and appropriate data is transmitted and received therebetween.

Figure 2:
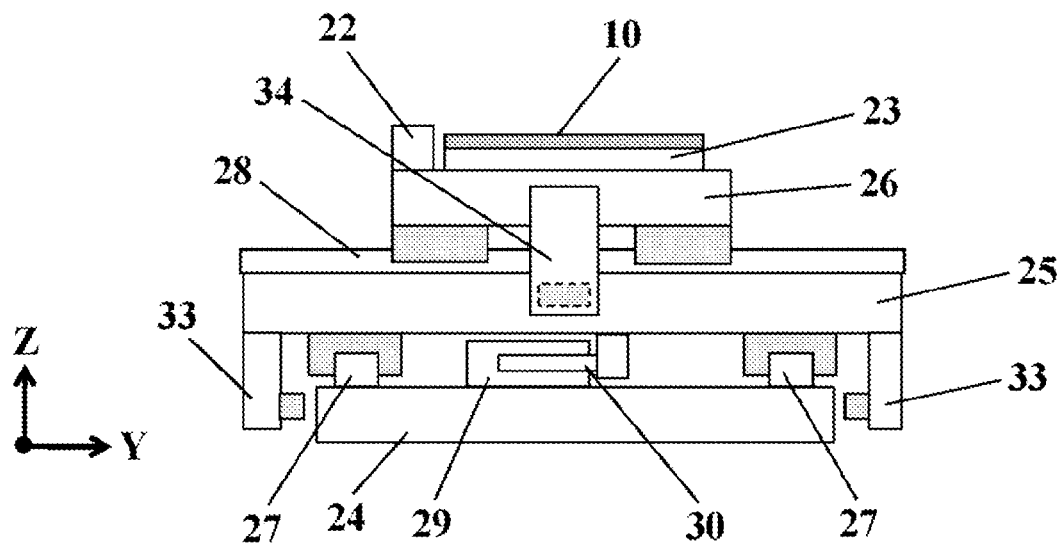
FIG. 2 is a front view of a stage of a first example.
Figure 3:
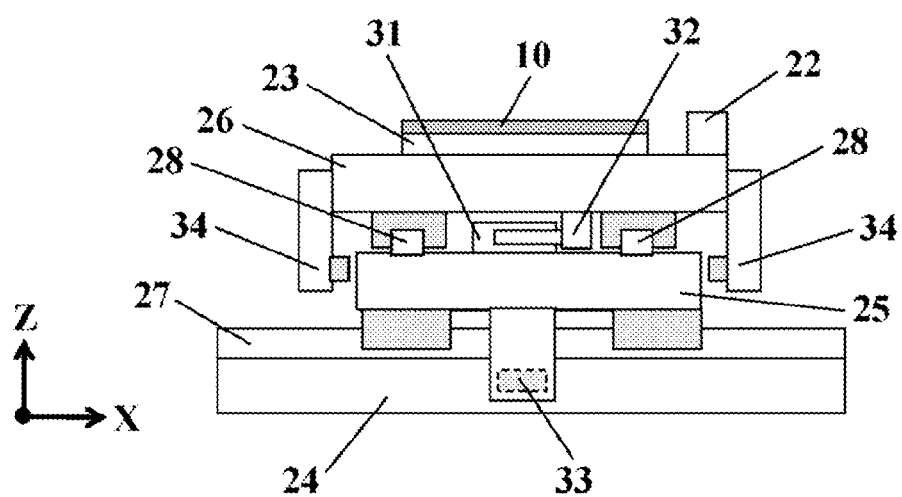
FIG. 3 is a side view of the stage of the first example.

A structure of the stage will be described with reference to FIGS. 2 and 3. FIG. 2 is a front view of the stage 8 of the example and FIG. 3 is a side view of the stage 8 of the example. Moreover, the structure of the stage described below is an example and the structure of the stage is not limited to the following description. For example, a structure of a stage described in a second embodiment may be employed.

An X linear motor fixing element 29 and an X guide 27 are installed on a base 24 supporting an entirety of the stage 8. An X table 25 is mounted on the X guide 27. An X linear motor movable element 30, an X brake 33, a Y linear motor fixing element 31, and a Y guide 28 are installed on the X table 25. A Y table 26 is mounted on the Y guide 28. A Y linear motor movable element 32, a Y brake 34, the electrostatic chuck 23, and a bar mirror 22 are installed on the Y table 26. In the following description, both the linear motor movable element and the linear motor fixing element are simply referred to as a linear motor or a motor.

A force is generated by an interaction of the X linear motor fixing element 29 and the X linear motor movable element 30 in a direction of the X guide 27. More specifically, a current flows through a coil and thereby a force is generated by an interaction of the coil and a magnet and the X table is moved along the X guide 27 together with the X linear motor movable element 30 by the force. Furthermore, the X table can be maintained in a static state by a friction force generated by pressing the X brake 33 against the base 24. It is the same for the Y-direction, but the Y brake 34 presses against the X table 25 and the Y table 26 is maintained in the static state by the friction force. The brake of the configuration is pressed from both sides of each table and forces are applied in directions opposite to each other. Thus, a force other than the friction force by the brake is offset.

As an example of the above configuration, the fixing element of the linear motor may be the magnet and the movable element may be the coil. The movable element of the linear motor may be formed of a plurality of coils. In addition, as an example, the fixing element of the linear motor is formed of a plurality of magnets and adjacent magnets are disposed so as to form a magnetic field in different directions from each other. The above configuration illustrates a configuration of a moving coil in which a coil side is moved, but the linear stage of the example is not limited to the above configuration. In the linear stage, there is a mechanism in which the current flows through the coil by driving of the linear motor and the thrust force is obtained by generating the magnetic field, but simultaneously it becomes a heat source by a coil resistance.

Furthermore, it is preferable that the brake is an active brake including an actuator such as a piezoelectric element and can perform ON/OFF control, but a specific configuration is not limited to the above configuration and the brake may be an active brake in which a movable table is maintained in the static state.

An operation of the stage, that is, control of the linear motor movable element, the linear motor fixing element, and the brake respectively in the XY-direction is performed by the control system 16. That is, control of a current amount of the motor described below is performed by the control system 16. A control signal is transmitted and received by each signal line between the control system 16 and each member.

Figure 4:
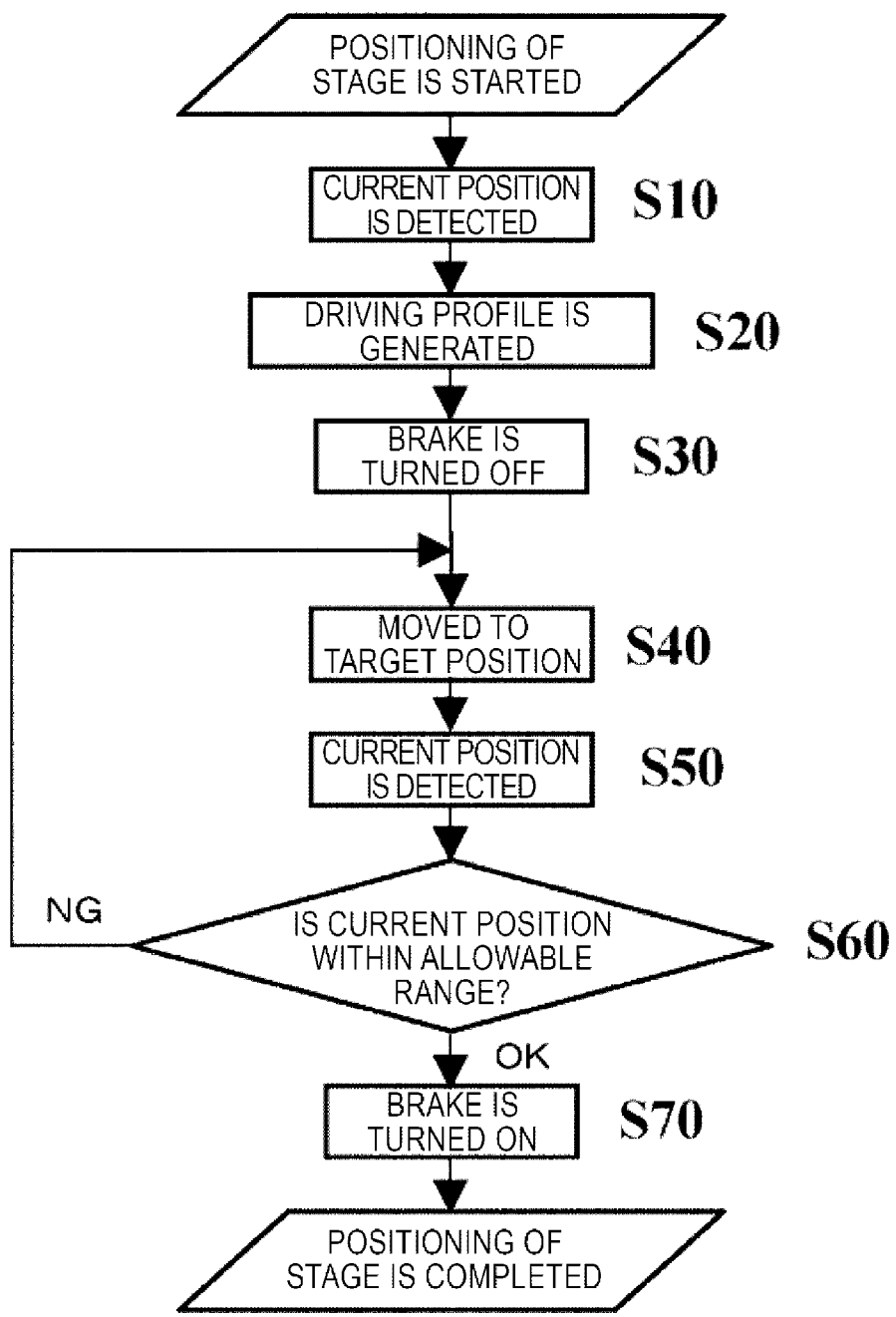
FIG. 4 is an explanatory view illustrating a flowchart of stage positioning of the first example.

Next, a sequence during movement of the stage will be described with reference to FIG. 4.

First, current position information of the stage is obtained by information obtained by the laser interferometer (S10).

Next, a driving profile is generated from driving conditions such as the current position, a target position, a speed, and acceleration (S20).

Next, the actuator of the brake is turned OFF and the brake is released (S30) and moving to the target position is started (S40).

A determination whether the target position is within an allowable range of the target position is executed in real time (S60) while obtaining information of the current position by the laser interferometer (S50). Here, real time means to include measurement at a predetermined time interval in which a moving distance of the stage per a time interval for measuring the position of the stage is sufficiently short.

If the determination is okay, the brake is turned ON (S70), the position of the stage is fixed to the position, and the operation of positioning is completed.

As described above, the heat source of the linear motor is the coil section. In the configuration described above, heat is generated from the X linear motor movable element 30 and the Y linear motor movable element 32. The heat amount is greater than a radiation amount radiated through the guide rails and the base and a temperature of an entirety of the stage is increased during driving of the stage. On the other hand, the heat amount when the stage is stopped is smaller than that when the stage is driven. Thus, the temperature of the entirety of the stage is lower than that when the stage is driven. Thus, if the stage repeatedly moves and stops, the temperature of the stage is varied and thus a positioning accuracy is deteriorated. This will be described in detail with reference to FIGS. 5 to 7.

Figure 5:
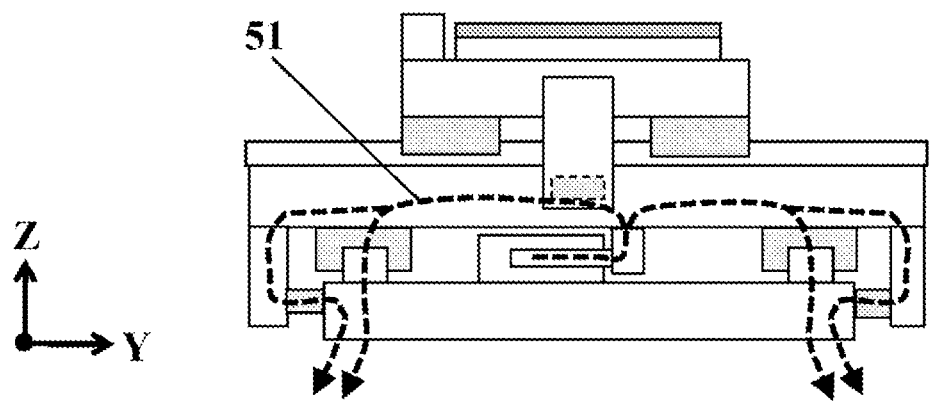
FIG. 5 is an explanatory view illustrating a transmission path of heat generated by an X-axis linear motor.
Figure 6:
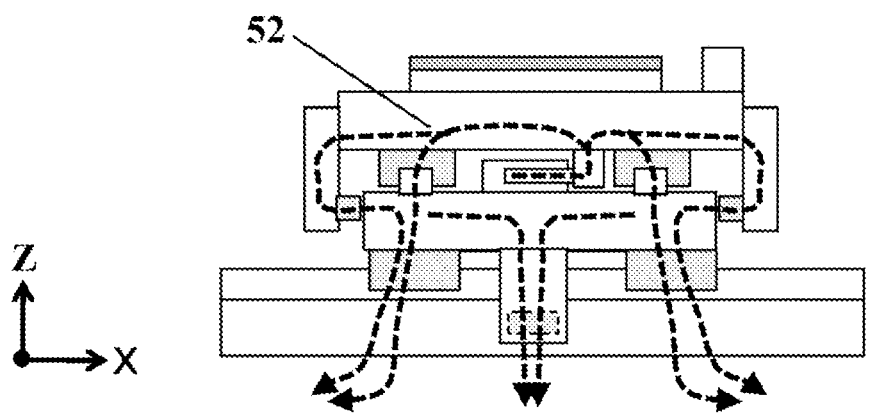
FIG. 6 is an explanatory view illustrating a transmission path of heat generated by a Y-axis linear motor.

First, a transmission path of heat from the linear motor will be described with reference to FIGS. 5 and 6. Here, in order to consider heat transfer during stopping of the stage, an ON state of the brake is illustrated. FIG. 5 illustrates a transmission path 51 from the X linear motor movable element and FIG. 6 illustrates a transmission path 52 from the Y linear motor movable element.

Heat of the X linear motor movable element passes through the X table and reaches the base through the X guide or the X brake. Since the base is mounted on the sample chamber, the heat transferred to the base is transmitted to the sample chamber and is radiated to the atmosphere. In addition, if the sample chamber includes a structure through which cooling water flows, the heat is absorbed by a temperature controlling device (not illustrated) through the cooling water.

The heat of the Y linear motor movable element passes through the Y table and reaches the X table through the Y brake or the Y guide. Thereafter, the heat reaches the base through the X guide or the X brake and is absorbed in the sample chamber by the cooling water from a chiller (not illustrated).

Here, in order to simplify a heat transfer model, it is assumed that the temperature is higher in the order of the Y table, the X table, the base, and the sample chamber. Thus, the heat transfer has a path flowing from top to bottom of the view. In fact, a phenomenon in which the temperature of the table is reversed occurs in a transient state, but since the invention is not intended to be affected by effects thereof directly, here, a simplified model is assumed. Furthermore, in fact, heat exchange occurs due to radiation, but since the amount of heat exchange is small compared to the heat transfer, here, the heat exchange is ignored.

In such a stage, since a temperature gradient is generated based on the linear motor movable element as a starting point, the temperature of each part is not uniform. In a method for controlling the temperature by mounting a heater on the table, it is difficult to simulate such a temperature gradient. Specifically, in a practical apparatus operating state, since a main heat source is the actuator, the temperature gradient changes every hour and the portion in which the temperature sensor is present can be controlled to be a desired temperature, but it is difficult to keep the entirety of the stage at the same temperature at all times. If temperature control of the stage is performed by the temperature sensor and the heater, a large number of the heaters and the temperature sensors are mounted and very complex control is required so as not to interfere each heater control. Furthermore, since the heater and a control device for the heater are required, it leads to an increase in cost.

Furthermore, in the stage configuration in which a heating section (coil) of the linear motor is not moved, it is easy for the fluid to flow through the heating section, but if the coil that is the heating section is movable, a tube through which the fluid flows is moved in accordance with the operation of the coil and if damage such as rubbing occurs, there is a risk that a vacuum inner vessel is contaminated.

Next, in a case where the stage repeats moving and stop, the temperature change of the stage will be described with reference to FIG. 7.

Figure 7:
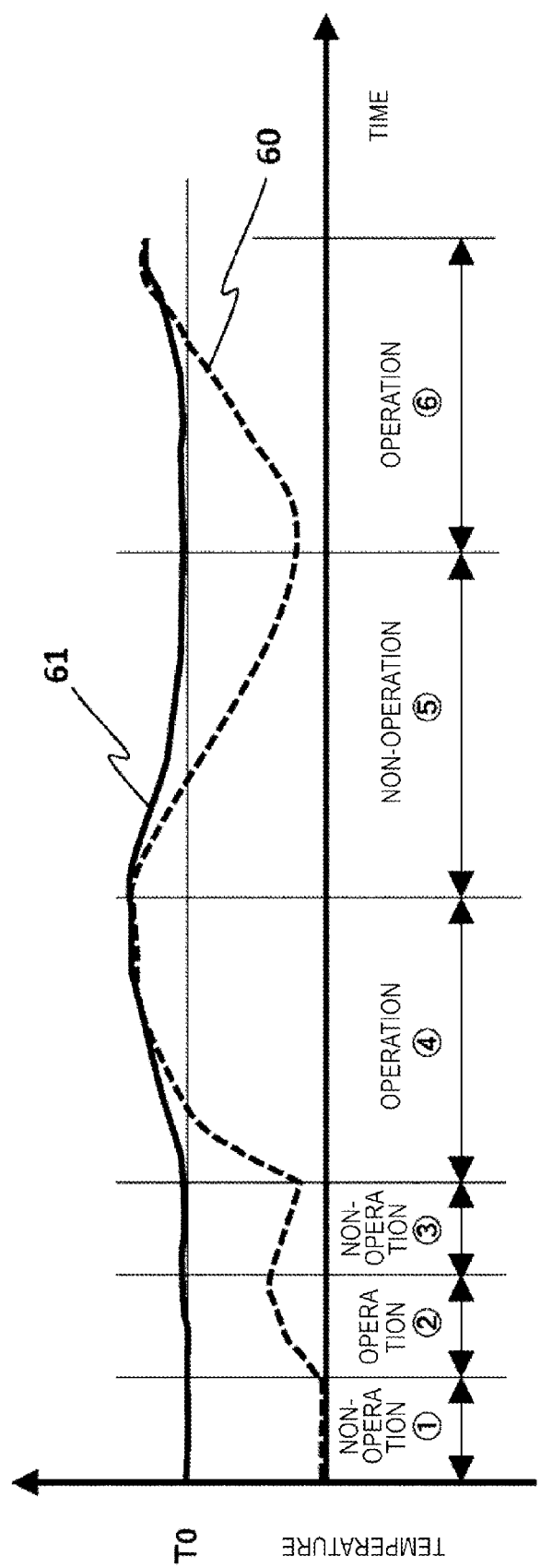
FIG. 7 is a comparison explanatory view illustrating a temperature change of the stage.

A broken line 60 of FIG. 7 indicates the temperature change of the stage of the related art which does not implement temperature countermeasures. When the apparatus is operated, since there is the stage operation, the temperature rises and when the apparatus is not operated, the temperature is lowered. Thus, the temperature of the stage is greatly changed by an operation time, a stage operation frequency, and a non-operation time. Here, the operation time indicates a time during the stage being actually moved and the non-operation time indicates during the stage being stopped.

Thus, in the example, therefore, a thrust force is generated in the linear motor within a range of the friction force (the maximum static friction force of the stage against the guide rails) or less while applying the brake during the non-operation time. That is, maintaining the static state of the stage and when the stage is maintained in the static state, the current amount flowing through the coil is greater than the minimum current amount required for generating the thrust force greater than the friction force of the brake. Moreover, in the linear motor mechanism, as described in a third example, a corresponding relationship between the coordinates of the stage and a current value, that is, a relationship (hereinafter, referred to as current profile) between a magnet position of the linear motor fixing element and the current value flowing through each coil is set and stored by a driver of the linear motor. In the linear motor stage, the most thrust force is obtained generally when the current amount of the coil of each phase is a current value corresponding to the coordinates of the target. Thus, the phrase "the minimum current amount to generate the thrust force greater than the friction force of the brake" herein means a current amount generating the thrust force greater than the friction force of the brake in a phase of the optimum current profile to generate the thrust force to the stage.

Thus, it is possible to generate heat from the motor portion similar to that when the stage is operated while maintaining the static state of the stage. Specifically, when the friction force of the brake is equal to or greater than the thrust force of the motor during the stage being operated, since the same or more current amount that is needed during stage being operated can flow through the motor, the heat generation can be about the same level. In a case where the current to the linear motor is controlled by using the method of the example, the temperature change of the stage is a solid line 61 of FIG. 7. A symbol TO indicates a temperature reached when the stage is stopped and the warming up operation is performed in a sufficient amount of time. Hereinafter, performing control to generate heat in the linear motor while the apparatus is non-operated is referred to as the warming up operation. Specifically, in this specification, "warming up operation" means for the current to flow through the coil of the linear motor so as to apply the thrust force to the stage while maintaining stopping of the stage.

Figure 8:
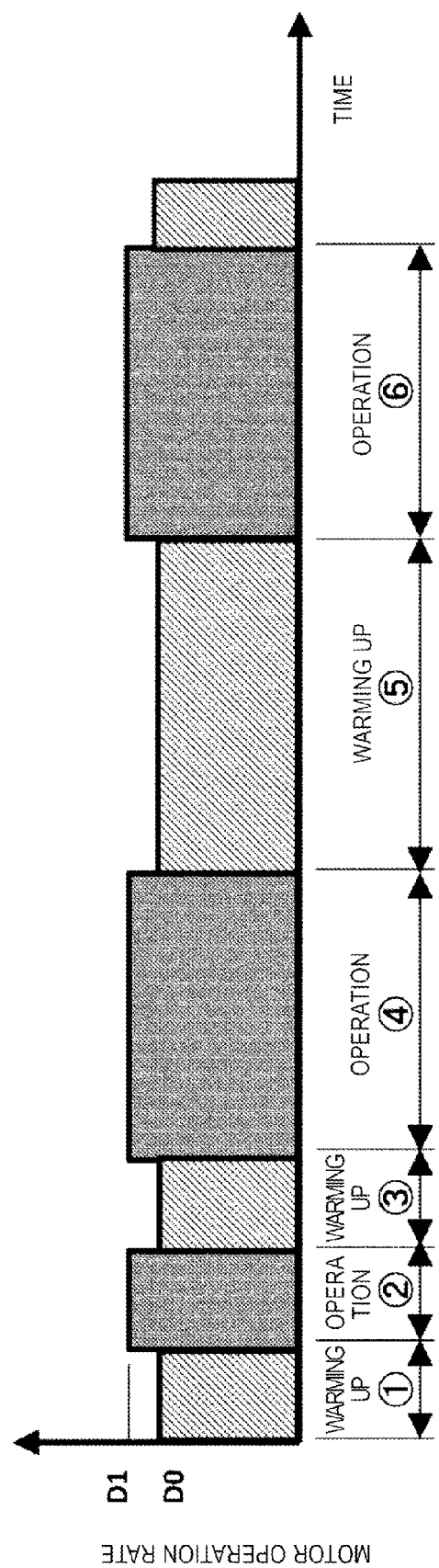
FIG. 8 is an explanatory view illustrating a motor operating state during a warming up operation.

FIG. 8 illustrates an operation rate of the motor if the example is used. Here, the operation rate of the motor indicates an average current amount per a predetermined time for a rated current of the motor and the heat amount of the motor is great as the operation rate is increases. The predetermined time is a time interval used to calculate the operation rate of the motor and, for example, may be a constant time interval or unit time. The operation rate=average current÷rated current and is preferably and usually 1 or less considering a risk of burnout or the like of the motor. A horizontal axis of FIG. 8 corresponds to a horizontal axis of FIG. 7. The operation rate of the motor is an amount corresponding to the current amount to the motor and the heat amount per unit time.

When the stage is operated, the operation rate of the motor is D1 and when the stage is not operated, the operation rate of the motor is D0. Here, if the motor is operated at D0, if the brake is not applied, the stage is driven and the brake of the friction force greater than the thrust force when the operation rate of the motor is D0 is applied. Thus, it is possible to maintain the stage in the static state.

Moreover, as described above, in the example, the heat amount generated in the linear motor during the non-operation time is equal to the heat amount generated by the operation of the stage during the operation. Thus, it is possible to reproduce the same heating situation as the operating state even in the non-operation state, but in practice, the operation rate of the motor during the warming up operation is calculated from a past stage movement record. Thus, a difference between the operation rate of the motor during moving of the stage and the operation rate of the motor during the warming up operation occurs. Thus, both do not have completely the same operation rate. Nevertheless, if the warming up operation during non-operation of the apparatus can be the operation rate close to that of a practical driving state, the temperature change is suppressed as shown in the solid line of FIG. 7.

A calculation method of the thrust force applied to the linear motor will be described with reference to FIGS. 9 to 11.

Figure 9:
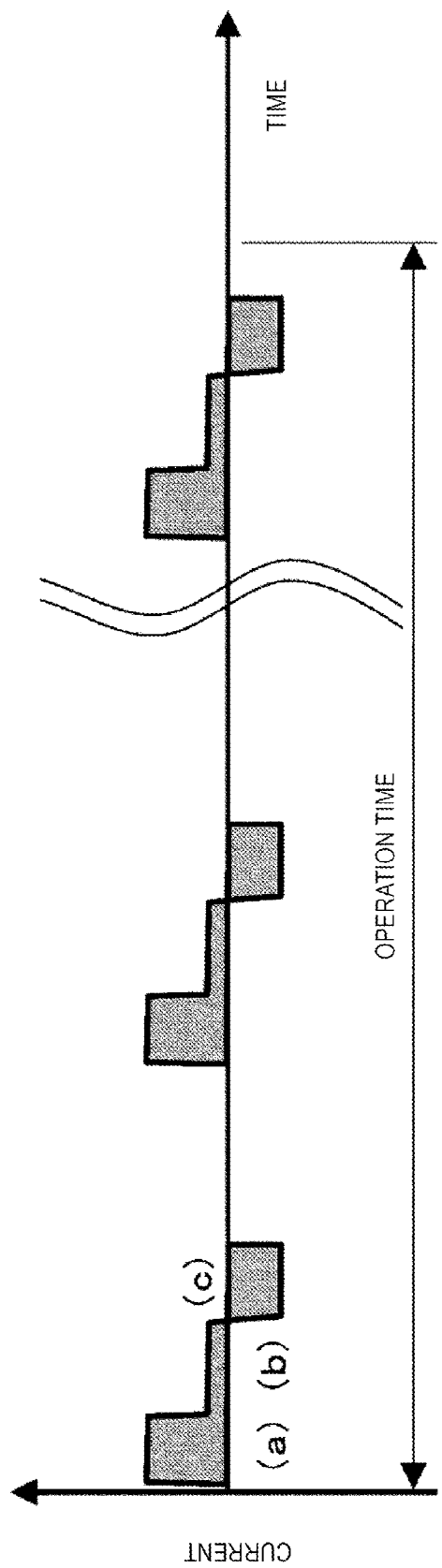
FIG. 9 is an explanatory view illustrating a current flowing through the linear motor during driving of the stage.

FIG. 9 illustrates the current flowing through the linear motor movable element (coil) when the stage is moved intermittently. During a stand-by time of the operation of the stage mainly consisting of an acceleration section (a), a constant speed section (b), and a deceleration section (c), obtaining of the SEM image, a transportation operation of the wafer, and the like are executed. Here, in the constant speed section (b), since a slight thrust force is required by a rolling resistance of the guide or a viscous resistance of oil, the current flows. In addition, in the deceleration section (c), on the contrary, since a load of the motor is reduced by the rolling resistance of the guide or the viscous resistance of oil, the current value is smaller than that of the acceleration section (a).

A heat amount W of the coil can be obtained by the following Expression.

$$W = V \cdot I = \Omega \cap I^2$$

Figure 10:
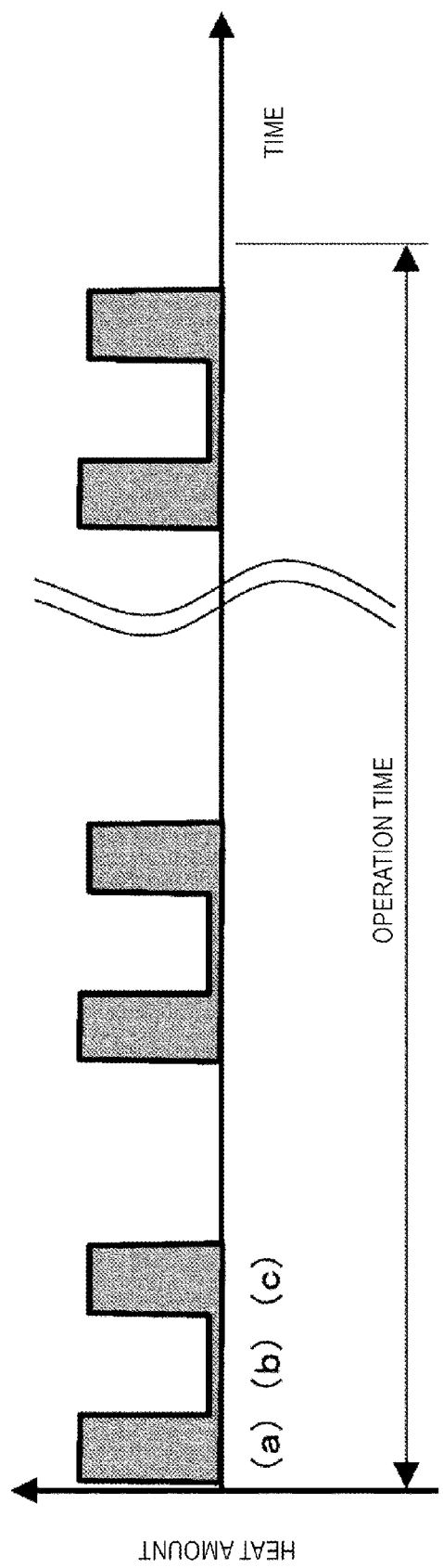
FIG. 10 is an explanatory view illustrating a heat amount generated by the linear motor during driving of the stage.
Figure 11:
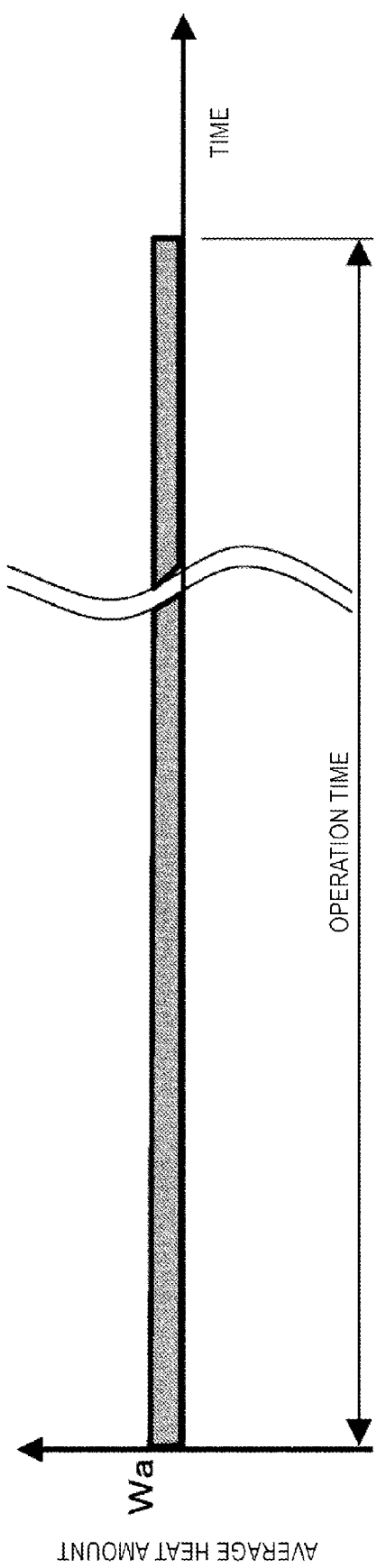
FIG. 11 is an explanatory view illustrating an average heat amount generated by the linear motor during driving of the stage.

Thus, the heat amount generated per unit time by the current of FIG. 9 is as illustrated in FIG. 10. If a total operation time T divides a filled area, an average heat amount Wa during an operation can be calculated (see FIG. 11). Next, it is possible to obtain an average current amount Ia from the average heat amount Wa by the following Expression.

$$Ia = (Wa/\Omega)^{1/2}$$

It is possible to continue the heating state equivalent to the operation time by flowing the average current amount Ia through the linear motor in the non-operation time. However, the upper limit value of the thrust force is calculated in advance such that the thrust force exceeding the friction force of the brake is not generate and it is necessary to elaborate a control method to prevent the thrust force from being the upper limit value or more by software or electrical hardware.

The current value flowing during the warming up operation, that is, the thrust force generated by the linear motor during the warming up operation can be determined from the past history of the thrust force. Specifically, a thrust force command value (current value) during moving of the stage is stored in a storage section such as a memory and the thrust force can be calculated from thrust force command value logs and the operation time accumulated in the control system when the operation time is completed. That is, if an integral value of the current values over the total operation time is converted to the heat amount and is divided by the total operation time, the average heat amount per unit time is obtained. Thus, the current value corresponding to the average heat amount may be a current amount flowing during the warming up operation. Moreover, here, for the sake of the description, the total operation time is averaged, but a predetermined time range to be object for calculation is set and the set time is averaged.

Thereafter, it is determined whether or not the thrust force command value exceeds the friction force of the brake that is set in advance and if the thrust force command value does not exceed the range, the value is employed as the command value during non-operation. On the other hand, if the thrust force command value exceeds the friction force of the brake, the upper limit value that does not exceed the friction force of the brake is applied as the thrust force command value. Here, if the maximum value is set considering a safety rate to the friction force, it is preferable because the stage is in a stably unmoving situation even if there is an influence of the temperature or an influence of changes over time. The process of obtaining the current amount described above may be performed each time when a series of the sequence is completed or may be performed each time when a plurality of the sequences is executed. Also, it may be performed for every predetermined time.

In the practical apparatus operating situation, a stage operation is executed in accordance with a sequence that is set in advance called an inspection recipe. FIG. 1 illustrates an example thereof and the sequence operation can be classified into operations R1 to R4.

Figure 12:
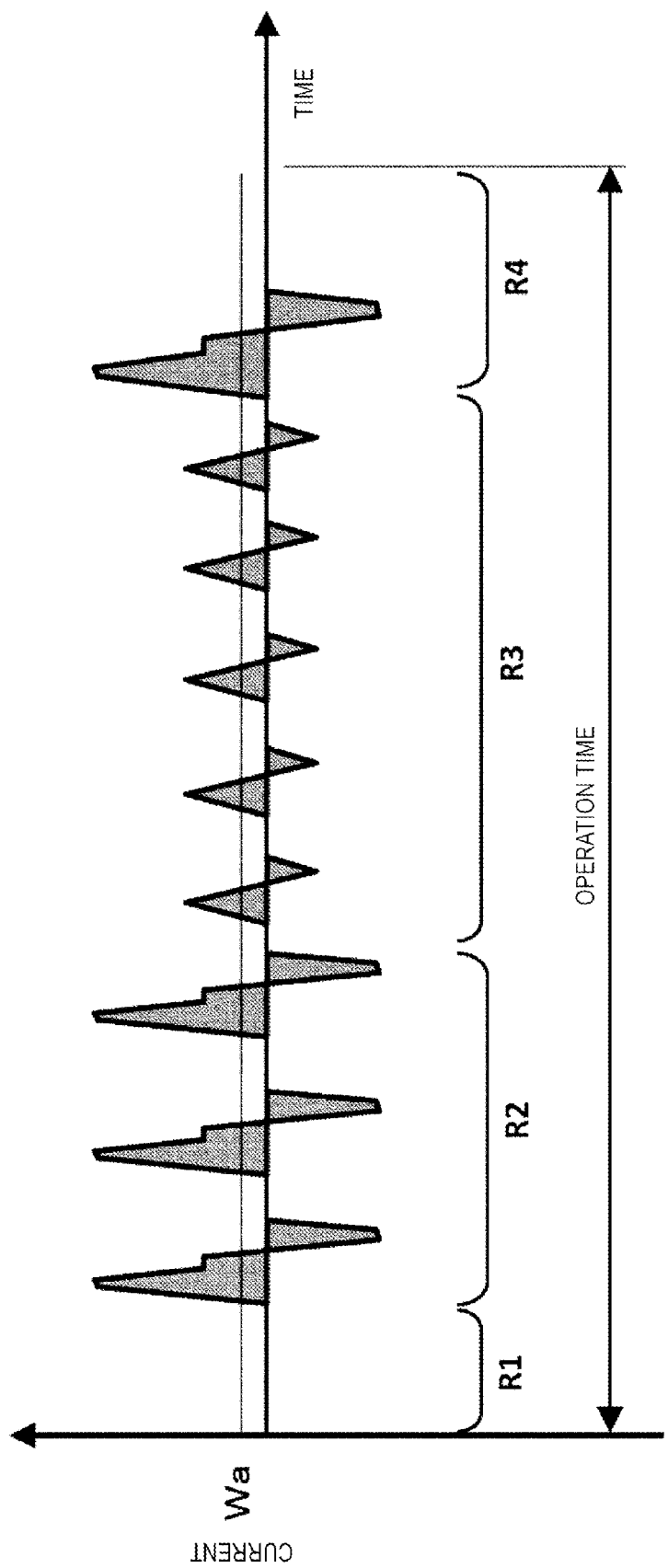
FIG. 12 is an explanatory view illustrating a current amount flowing through the linear motor in a wafer processing sequence.

A symbol R1 is a wafer transportation operation time. In R1, since moving of the stage is not present, the current value of the motor is 0. A symbol R2 indicates an alignment operation in which a plurality of patterns on the wafer are confirmed and the coordinates of the apparatus and the coordinates of the wafer are combined. In FIG. 12, it is assumed that the stage control is jerk control in which the acceleration is gradually increased and decreased. Thus, a graph of the current value has a slope. In FIG. 9 described above, the acceleration and the deceleration are assumed in which the acceleration has a constant value and the jerk control is not present. Thus, the graph of the current value comes to have a rectangular shape. Of course, also in R2, as illustrated in FIG. 9, the acceleration or the deceleration may be performed by making the acceleration constant. The following is the same as R3 and R4. R3 is an operation to actually inspect. In R3, since the stage moves to many points within the wafer, a moving distance per one time is short and the process proceeds to the deceleration without reaching the maximum speed. Thus, the current value flowing through the motor is also small. R4 is an unloading operation of the wafer. The stage moves to an unload position and then it is in the stand-by time. It is possible to derive the average heat amount Wa based on the history of a series of the stage operation. Thus, for example, the average current amount during the warming up operation may be obtained in the next wafer inspection process each time the wafer is unloaded. Furthermore, if the wafer is continuously input, since such a stage operation is continuous, it may be a calculation target until all wafer inspection sequence is completed. Thus, calculation accuracy is further increased and it is possible to obtain the command value during the warming up operation matching the actual conditions.

Furthermore, as another method, if the recipe of execution scheduled is known and the stage moving profile can be predicted to some extent, it is possible to calculate the current command value during the warming up operation. That is, the time average of the thrust force that occurs when the stage is moved as the operating schedule is guessed based on the future operating schedule of the stage and it is possible to determine the thrust force (that is, the current value flowing through the coil of the linear motor) during the warming up operation based on a guessed result.

Furthermore, as another method, there is a method capable of efficiently controlling the temperature of the stage by calculating the temperature by expanding the time such as for every hour, for every day, and for every week.

Figure 13:
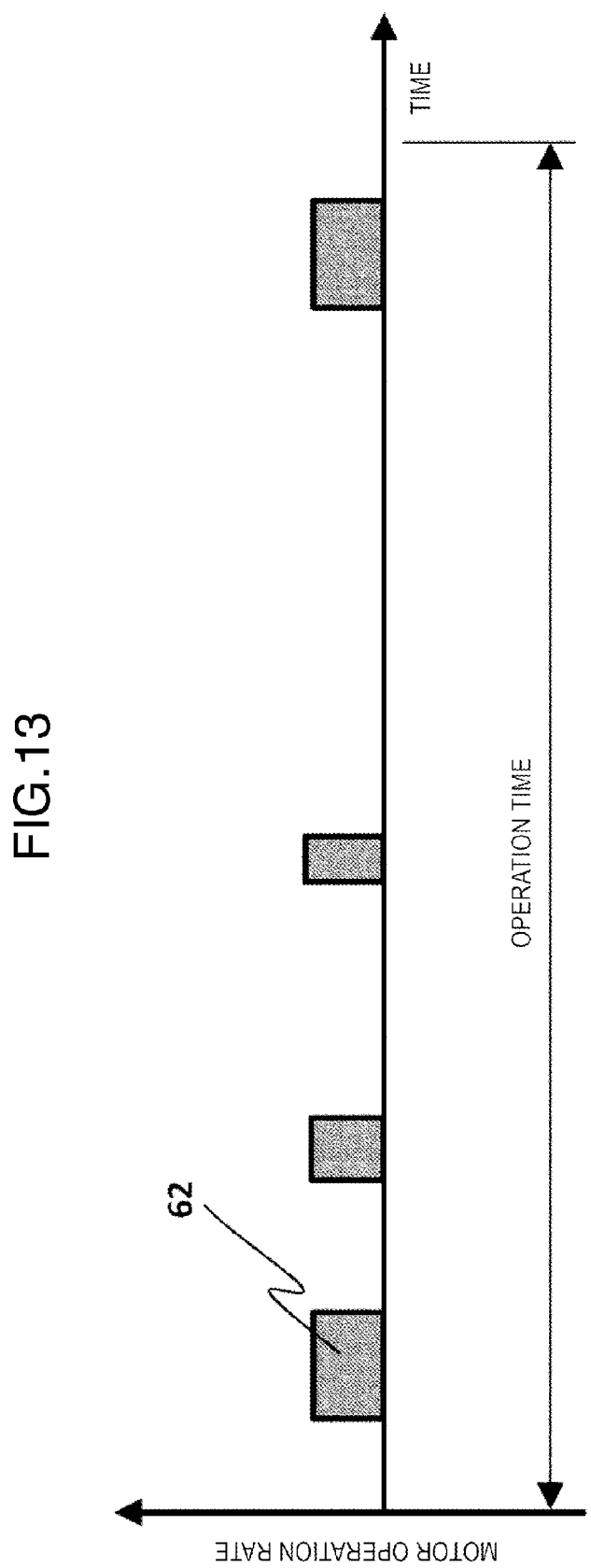
FIG. 13 is an explanatory view illustrating a motor operation rate in an apparatus having a low operation rate.
Figure 14:
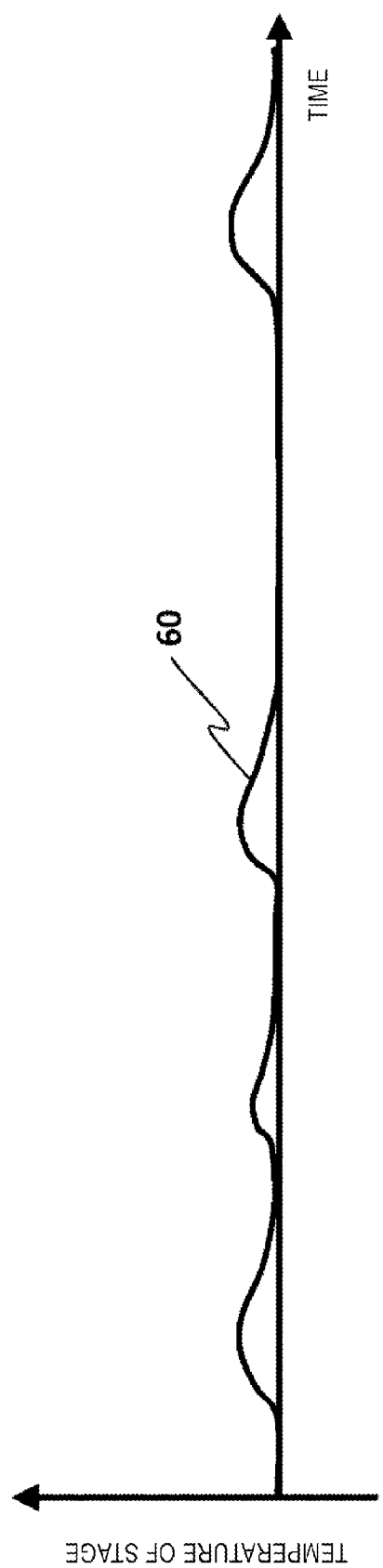
FIG. 14 is an explanatory view illustrating a temperature change in the stage of the apparatus having the low operation rate.
Figure 15:
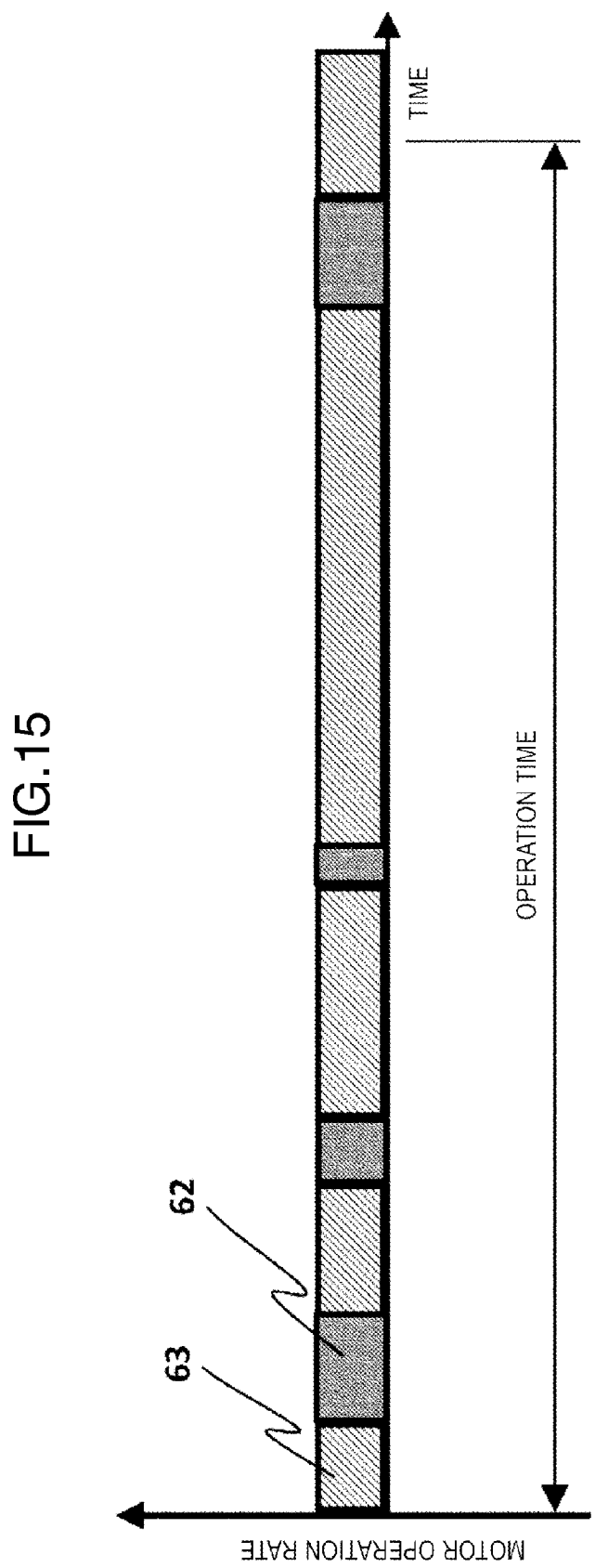
FIG. 15 is an explanatory view illustrating a current amount if the warming up operation is applied to the apparatus having the low operation rate.
Figure 16:
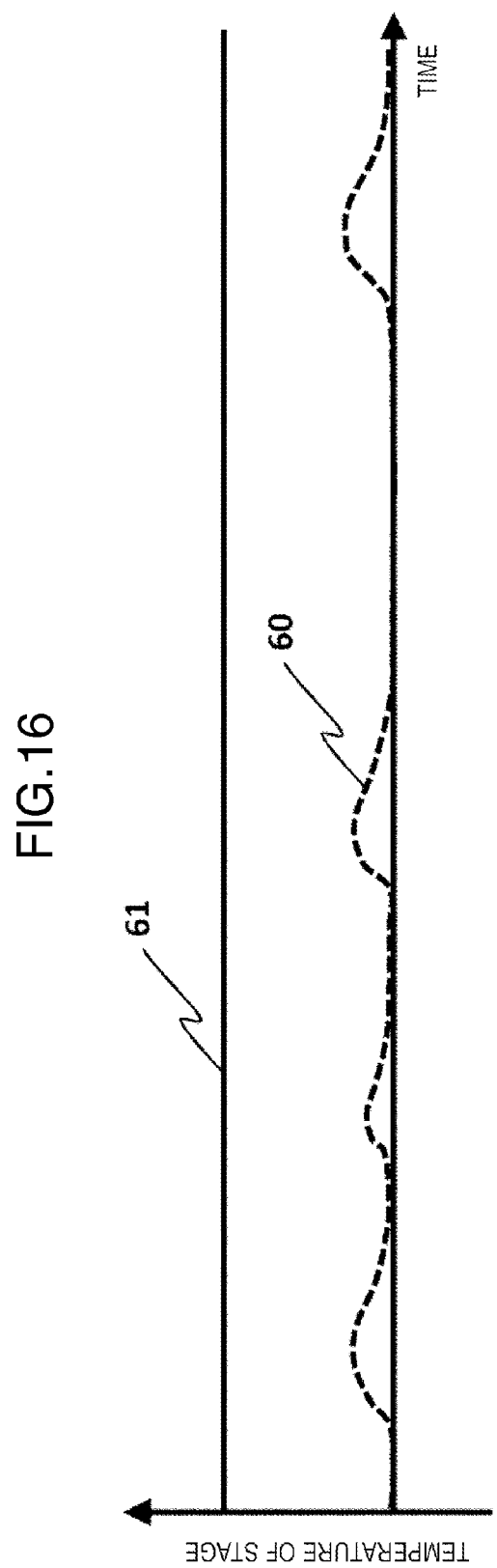
FIG. 16 is an explanatory view illustrating the temperature of the stage if the warming up operation is applied to the apparatus having the low operation rate.

For example, if only the inspection recipe observing one wafer is calculated, as illustrated in FIG. 13, in a situation in which the operation rate of the apparatus is low, non-operation of the apparatus is long and for only the observation of one wafer, as illustrated in FIG. 14, the temperature of the stage is not likely to rise and immediately goes back to an original temperature. Thus, also the next inspection is completed almost without receiving the influence of the temperature change. On the other hand, as illustrated in FIG. 15, if the command value calculated only by the inspection recipe observing one wafer in the non-operation state of the apparatus is continuously applied, as illustrated in FIG. 16, it is possible to constantly maintain the temperature of the stage in a state where the temperature is relatively high. However, power consumption is set largely by flowing the current corresponding to the situation in which the inspection recipe continuously flows even in the non-operation state of the apparatus.

Figure 17:
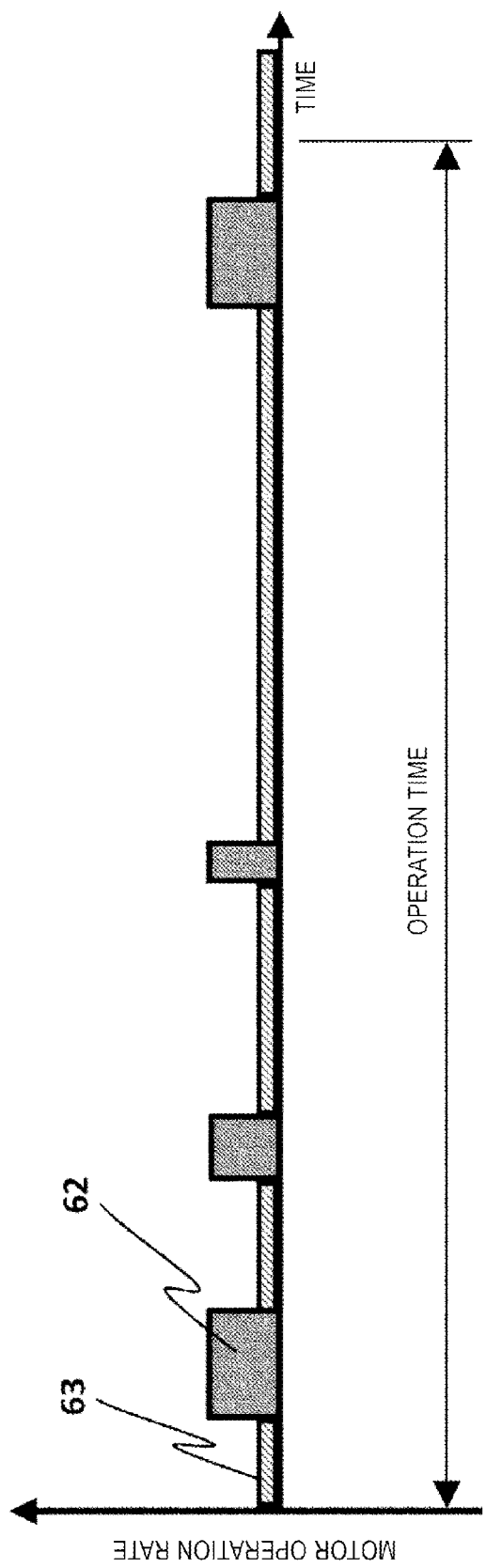
FIG. 17 is an explanatory view illustrating the current amount if the warming up operation with a reduced operation rate is applied to the apparatus having the low operation rate.
Figure 18:
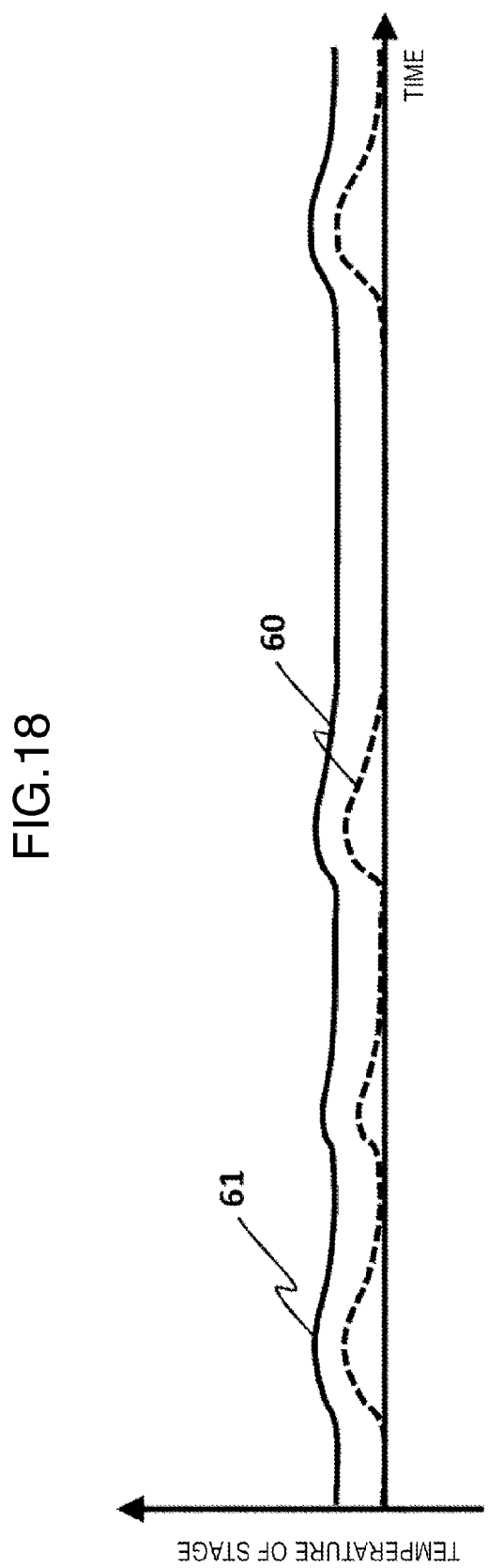
FIG. 18 is an explanatory view illustrating the temperature of the stage if the warming up operation with a reduced operation rate is applied to the apparatus having the low operation rate.

As described above, the time of the non-operation state of the apparatus is also included in the calculation of the command value by setting the calculation range of a predetermined time interval. Thus, if the temperature change can be allowed to a certain extent, it is possible to suppress the command value applied during non-operation of the apparatus. FIG. 17 illustrates a state where the time of the non-operation state of the apparatus is also included in the calculation of the command value and a current smaller than the current of the operating state is set in the command value during the warming up operation. As a result, as indicated by temperature curves of FIG. 18, there is a slight temperature change during the operation of the apparatus, but since the change is small during the non-operation, entire power consumption is suppressed. Thus, it is possible to suppress the temperature change. However, since the temperature change relates to various factors such as specific heat of the stage, driving conditions of the stage, the operation rate, and an exhaust heat capacity of the chiller, it is necessary to grasp in advance a correlation between the temperature and the command value during the warming up operation by an experiment.

Second Example

Figure 19:
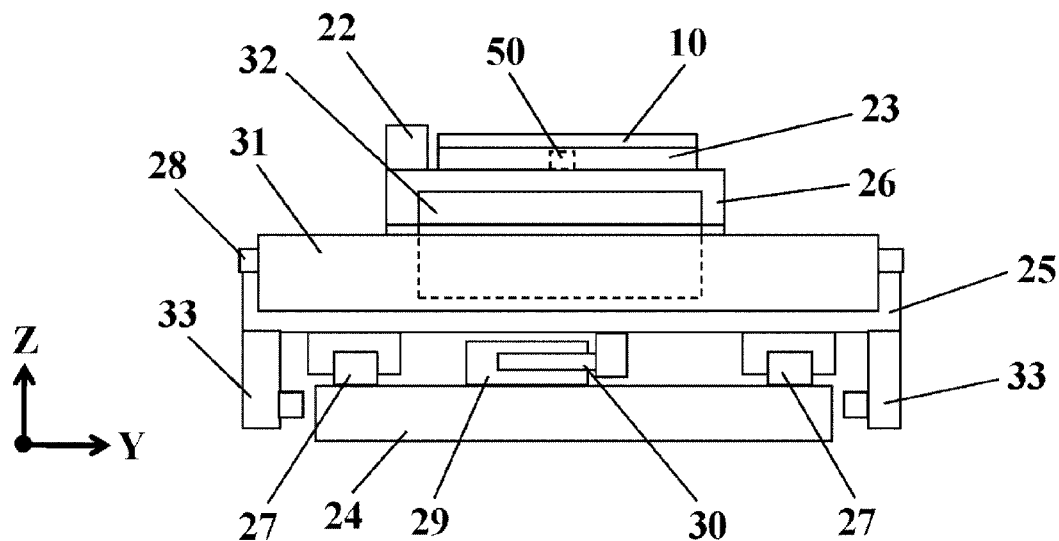
FIG. 19 is a front view of a stage of a second example.
Figure 20:
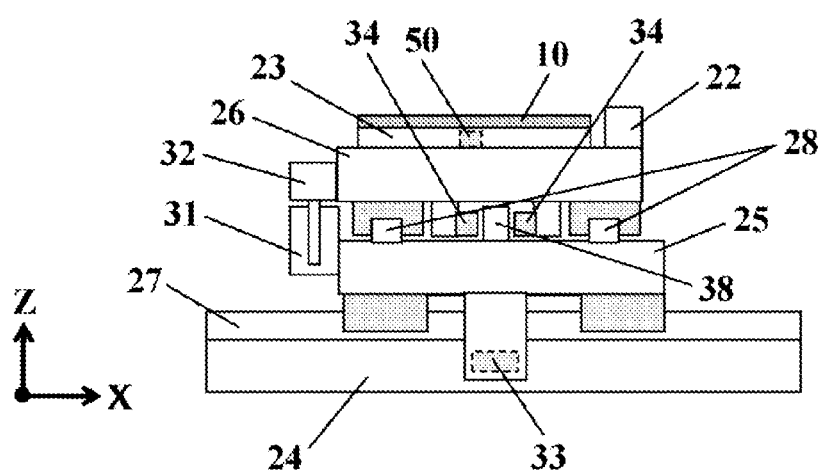
FIG. 20 is a side view of the stage of the second example.

Next, as a second example, a control method in which a temperature sensor is mounted on the stage and information thereof is fed back to the command value during the warming up operation will be described with reference to FIGS. 19 and 20. Hereinafter, a description regarding the same portions as the first example will be omitted.

In the first example, the operation rate of the stage is predicted and the current of the motor is set, but if the frequency of the inspection is greatly changed by time or if a recipe in which the operation rate of the stage is high and a recipe in which the operation rate of the stage is low are mixed in one inspection, it is difficult to accurately predict the heat amount of the motor. It is easy to maintain a constant temperature by mounting the temperature sensor on the motor and controlling the current amount based on the information of the temperature even if the operation rate of the stage is different.

In the example, a structure in which a Y brake is disposed at the center is described. A temperature sensor 50 measuring the temperature of the stage is attached to the stage of the example. The temperature sensor 50 may be attached to the stage of the structure described in the first example. Hereinafter, portions different from the structure of the stage of the first example are described.

In the stage of the example, a Y linear motor (Y linear motor fixing element 31 and a Y linear motor movable element 32) is mounted on a side surface of an X table 25 and a Y table 26, and a Y brake 34 is mounted on a center portion of the Y table 26. Two Y brakes 34 are configured to sandwich a guide rail 38 from both sides and has a structure that can offset a pushing force of the brake. The temperature sensor 50 is attached to the inside of an electrostatic chuck 23 and monitors the information of the temperature in a control system (not illustrated).

The control system performs feedback control of a value close to the temperature of the operating state of the apparatus to a command value during the warming up operation as a target temperature. That is, if the temperature is lower than the target temperature, the current less than the friction force of the brake is applied, the current value is decreased in the vicinity of a target value, the feedback control is executed, and thereby the temperature is always close to the target temperature.

Figure 21:
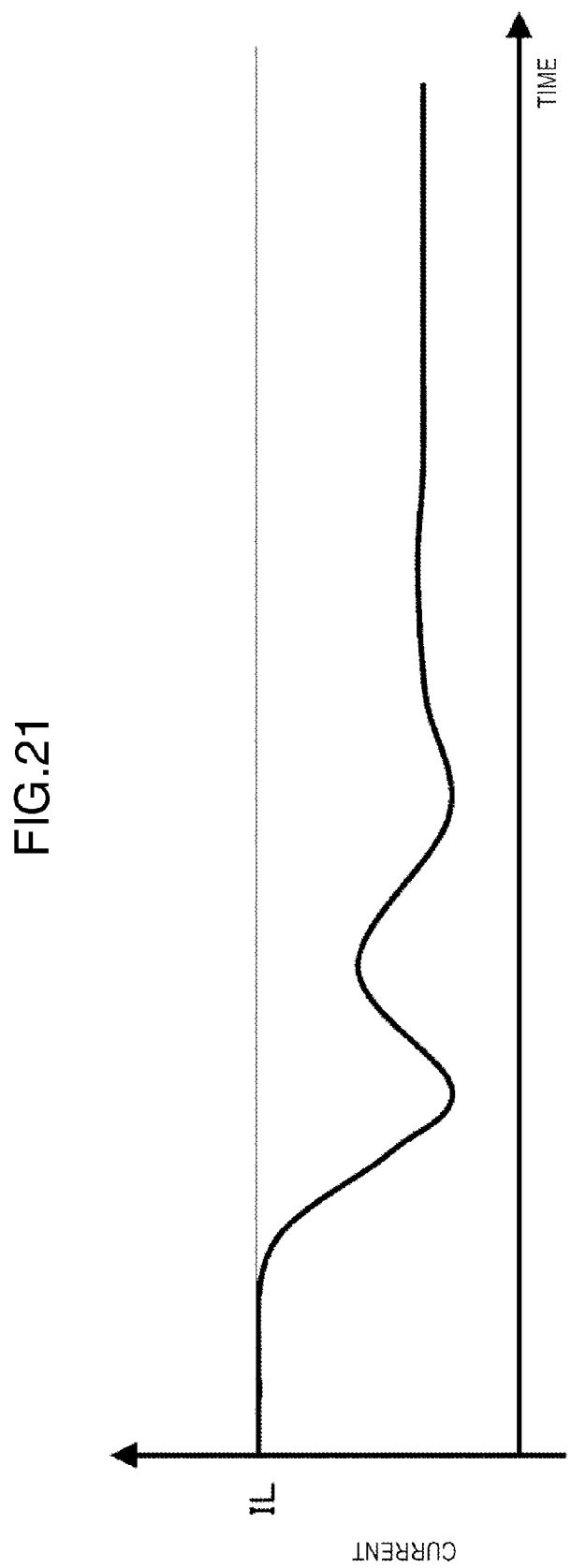
FIG. 21 is an explanatory view illustrating an example of a current control state of the second example.
Figure 22:
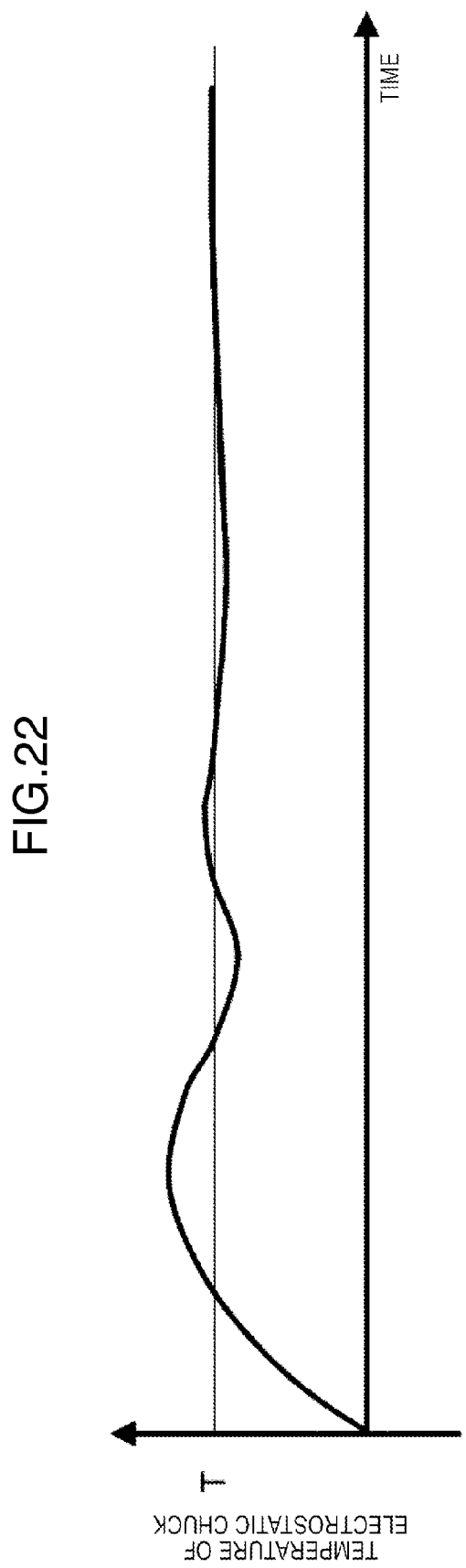
FIG. 22 is an explanatory view illustrating an example of a stage temperature state of the second example.

In this case, the command value and the temperature of the electrostatic chuck are indicated in FIGS. 21 and 22. In the example, PID control based on the information of the temperature sensor is assumed. That is, the current flowing through the coil during the warming up operation is determined such that the temperature measured by the temperature sensor is within a predetermined target temperature range. Control is performed such that the current flows at the upper limit value IL at first because the temperature is much lower than a target temperature T and the current is decreased if the temperature is close to the target temperature T. However, since there is a time constant of heat transfer, the temperature is increased and overshooting is caused, and then the temperature converges in the vicinity of the target temperature. In the example, a case where a difference between the temperature of the apparatus and the target temperature is great immediately after starting of the apparatus and the like is illustrated, but the temperature difference between an actual temperature and the target temperature is small during practical operation. Thus, the command value of the warming up operation is not changed so much and it is possible to constantly maintain the temperature of the electrostatic chuck in the operating state of the apparatus and the non-operation state of the apparatus.

Third Example

Figure 23:
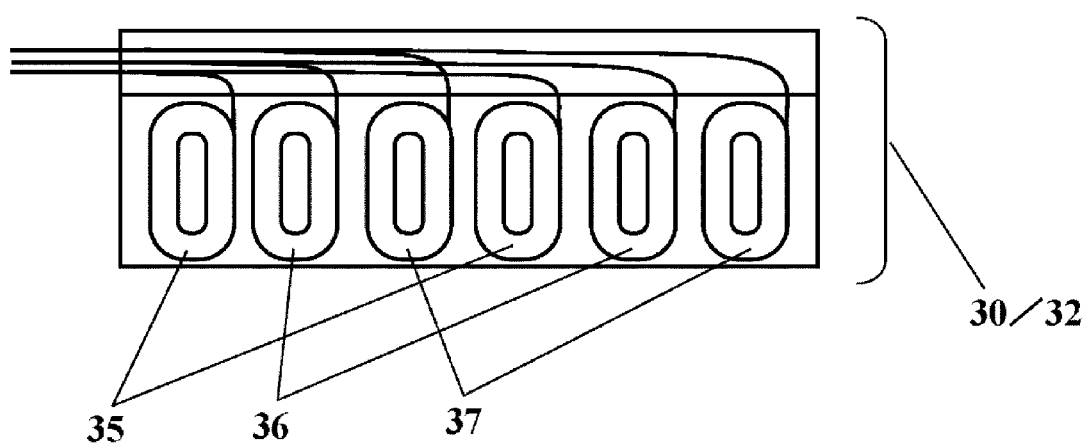
FIG. 23 is an explanatory view illustrating a coil configuration of a linear motor of a third example.

Next, a third example will be described with reference to FIGS. 23 and 24. In the example, an example is described in which the warming up operation described in the first and second examples is performed in each position by moving the stage by a predetermined distance for each predetermined time.

First, a structure of a linear motor is described. Typically, the linear motor is often configured of a coil of three phases (U phase, V phase, and W phase), and a plurality of same phases are used as each phase is one movable element. In FIG. 23, the movable element is indicated in which two coils of each phase are arranged. Linear motor movable elements (30 and 32) are configured of a total six coils consisting of U phase coils 35, V phase coils 36, and W phase coils 37. In the linear motor fixing element, a plurality of magnets are arranged such that adjacent magnets generate a magnetic field having different directions to each other.

Figure 24:
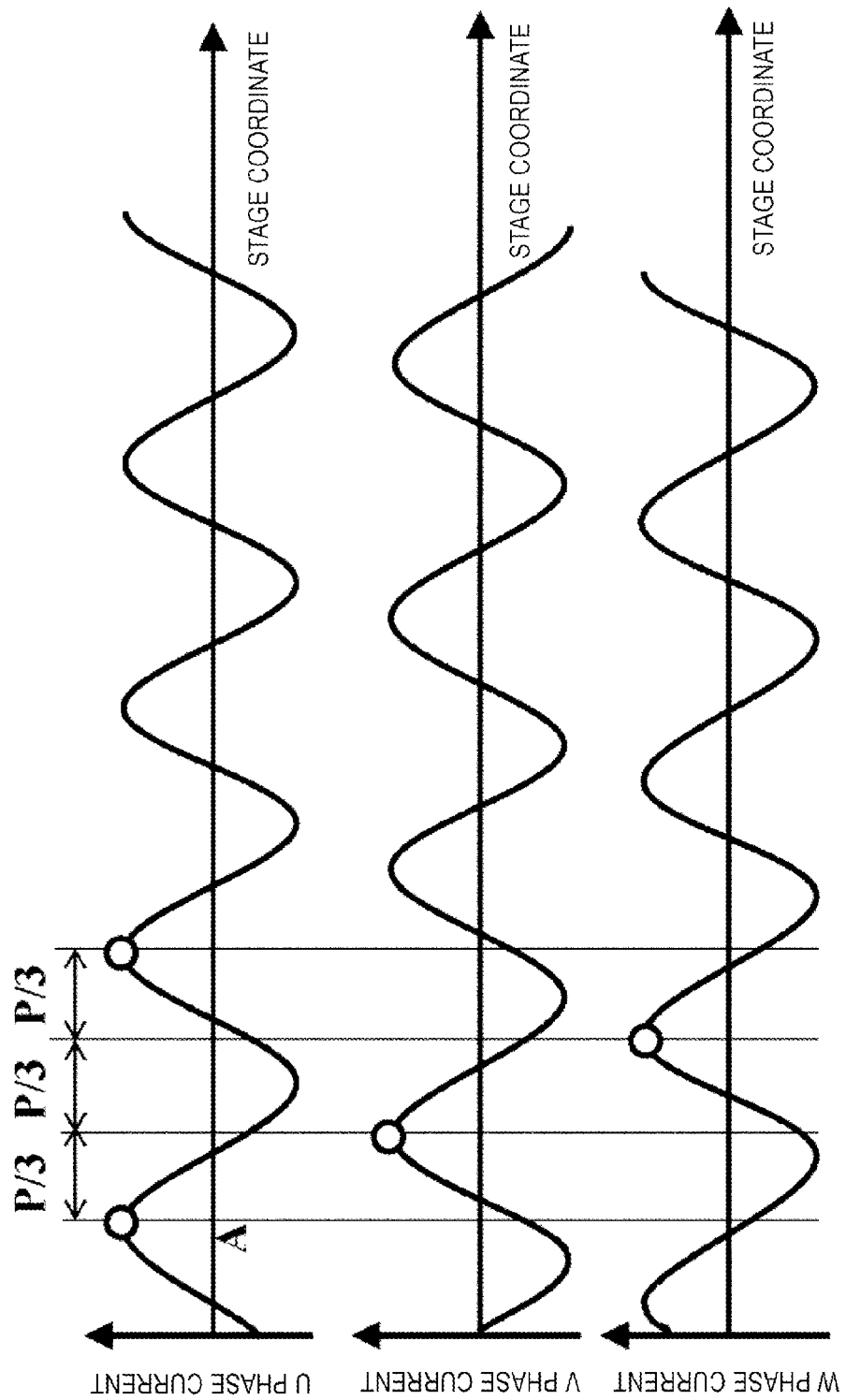
FIG. 24 is an explanatory view illustrating a current flowing through a coil of the linear motor of the third example.

FIG. 24 illustrates how the current flows through each phase in each coordinate if the stage is moved. A stage coordinate of the horizontal axis of FIG. 24 means a coordinate (for example, value measured by the laser interferometer) with respect to a reference position in the stage. A vertical axis of FIG. 24 is a current value flowing through the coil of each phase and a corresponding relationship between the coordinates and the current value, that is, a relationship (hereinafter, referred to as a current profile) between the position of the magnet of the linear motor fixing element and the current value flowing through each coil is set and stored by a driver of the linear motor. In the linear motor stage, in general, most thrust force is obtained when the current amount of the coil of each phase is a current value corresponding to a target coordinate.

If the warming up operation is executed in the stage coordinate, when the current flowing through each coil is determined based on a thrust force command, a sine curve-shaped current value is set while applying a phase difference of 360°÷3=120° to each phase because it is three phases (see FIG. 24).

Thus, a coil through which the current flows more and a coil through which the current flows less are present depending on the position of the stage. For example, in a stage coordinate A, a large amount of current flows through the coil of the U phase, but almost no current flows through the V phase coil and the W phase coil. Thus, if the warming up operation is continued in the same position, a temperature distribution is generated in the linear motor movable element. On the other hand, simultaneously, the warming up operation is continued also in the table of the stage, the temperature distribution is generated in the position and it is a temperature distribution different from that of the actual operating state.

The stage is moved for every time that is a trouble solution of the defect and thereby the temperature distribution is closer to the operating state. Furthermore, it is preferable that the moving distance is different from a magnet pitch (P) of the linear motor fixing element. If the stage moves at the same distance as the magnet pitch (P) forming the magnetic field in the same direction, it is because the same current flows through each coil in the following locations. For example, if a coil pitch is 60 mm, the moving distance of one time is 20 mm and the stage moves two times and if the warming up operation is executed at the same time in each position, a sum current value in three places is the same as in each coil. However, if the moving range of the stage is 500 mm and the like, the stage can be moved only in a limited operation range of the stage within the warming up time when the moving distance is short. Thus, if the moving distance L is $$L = n \times P + P \times (1/3) = P(n+1/3)$$

or $$L = n \times P + P \times (2/3) = P(n+2/3),$$

it is possible to set the temperature distribution of the movable element and the entire stage close to the operating state of the apparatus.

Moreover, ideally, the moving distance described above is preferable, but if the moving distance is a non-integer multiple of the magnet pitch (P), it is possible to obtain an effect that the temperature distribution is uniform.

The warming up operation described in the first and second examples is performed in each position by mounting the stage for every predetermined time by the moving distance determined as described above. Thus, a cumulative current value flowing through the coil of each phase within the predetermined time is the same and thereby the temperature distribution within the linear motor movable element and within the table of the stage is uniform. However, since it affects the service life of the movable section of the stage if the stage is frequently moved, it is further preferable that the time interval such as for every 30 minutes or every 1 hour can be a variable by setting the control software. Thus, it is possible to set the time interval in accordance with the operation situation of the apparatus.

Fourth Example

Next, a fourth example will be described with reference to FIG. 25. Hereinafter, a description regarding the same portions as the first to third examples will be omitted. In the first to third examples, an example is described in which the current flows through the motor while the brake is operated, but in this example, a method is described in which the current amount generating substantially the same heat amount as that when the stage is driven can be applied even if the brake is absent. That is, it is possible to perform the warming up operation described in the first to third examples by using the method of the example.

Typically, a driver (the control system) driving a linear motor executes control to increase efficiency by information of positions of the magnet and the coil. That is, the example is a system in which phase control of the current is executed such that a great thrust force is output with a small current and the stage is driven with a desired driving profile by suppressing heat generation as much as possible.

Figure 25:
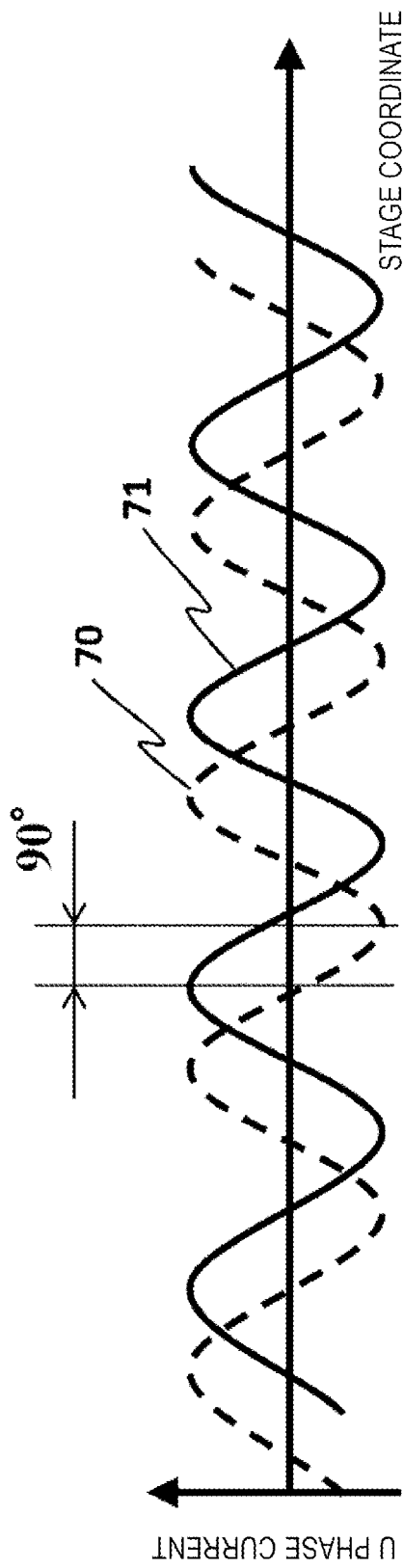
FIG. 25 is an explanatory view illustrating a current flowing through a coil of a fourth example.

As illustrated in FIG. 25, the efficiency is in the worst state, that is the thrust force is unlikely to be generated even if the current flows by controlling the current of a driver by changing to a 90° (or 270°) phase from a phase of the current that is at the maximum efficiency when performing the warming up operation. Moreover, FIG. 25 describes the U phase as a representative, but also similarly in the V phase and the W phase, the current control is executed by changing to the 90° phase from a phase of a normal state in the same direction respectively. That is, since the position of the magnet of the linear motor fixing element is not changed, a profile in which the current flowing through the coils of the U phase, the V phase, and the W phase is staggered by 90° (or 270°) from the current profile in which the maximum driving force is obtained is optimal as the current for the warming up operation. Thus, the current profile for the normal driving and the current profile for the warming up operation are stored, and the driver may switch the two current profiles depending on the operation of the apparatus. Moreover, regarding to control by a second current profile, since the thrust force is not actually operated in the stage, a current amount defined in the second current profile may be greater than a current amount defined in the first current profile.

For example, the driver of the linear motor has an I/O identifying a warming up operation mode and executes driving of the motor by changing control phase 90° (or 270°) when receiving a command of the warming up operation mode from a host controller. When returning to the normal stage operation, the driver receives a command of the warming up operation completion from the host controller and is returned based on the control phase, and executes driving of the stage. Moreover, it is possible to suppress the generated thrust force in principle even if the phase is not exactly 90° or 270°. For example, a phase shift of 80° can be set, and it is possible to suppress the thrust force of cos 80°=17% with respect to the generated thrust force of the normal phase. Thus, the ideal phase shift is 90°, but it is also possible to define a shift amount of phase depending on the generated thrust force that can be acceptable.

Effects of the example are to greatly decrease the current amount flowing lower than the friction force by the brake because the thrust force to the stage is very small. In addition, since a load to the brake can be also reduced, damage to the brake is not applied. Furthermore, if the thrust force generated when a required current amount flows can be suppressed to be equal to or less than a static friction resistance of the guide by improving detection accuracy of the position of the coil and the position of the magnet, and manufacturing accuracy of the coil and the magnet, it is possible to eliminate the brake itself and it leads to a cost reduction of the apparatus.

The first to fourth examples described above can be combined each other, can realize a constant temperature of the accurate stage by making the conditions required for the apparatus optimal, and can provide an apparatus having a high throughput. In addition, the same effects can be also expected for the stage used in the atmosphere by performing the control similar to each example described above.

It should be further understood by those skilled in the art that although the foregoing description has been made on embodiments of the invention, the invention is not limited thereto and various changes and modifications may be made without departing from the spirit of the invention and the scope of the appended claims.

We claim:

1. A charged particle beam apparatus for obtaining an image by applying a charged particle beam to an object, the charged particle beam apparatus comprising:
    a stage that moves the object along guide rails;
    a linear motor mechanism that is made of a coil and a magnet, and moves the stage by a thrust force generated by a current flowing through the coil;
    a control section that controls the current flowing through the coil; and
    a brake that fixes the stage,
    wherein the control section provides the coil with the current while applying the brake during a non-operation time of the stage in order to generate the thrust force which is equal to or less than a static friction force of the stage against the guide rails provided by the brake.

2. The charged particle beam apparatus according to claim 1,
    wherein the control section controls the current such that the current flowing through the coil in a state where the stage is fixed by the brake is equal to or greater than a current amount flowing through the coil in a state where the stage is operated.

3. The charged particle beam apparatus according to claim 2,
    wherein the thrust force generated by the current flowing through the coil in the static state of the stage being maintained is equal to or less than a friction force generated by the brake.

4. The charged particle beam apparatus according to claim 1,
    wherein the control section is capable of switching a first current profile in which the current amount flowing through the coil corresponds to position coordinates of the stage and a second current profile of which a phase is shifted from that of the first current profile.

5. The charged particle beam apparatus according to claim 4,
    wherein the first current profile is used when the stage is driven and the second current profile is used in a state where the stage stops.

6. The charged particle beam apparatus according to claim 1,
    wherein the control section has a first current profile in which the current amount flowing through the coil corresponds to position coordinates of the stage and a second current profile of which a phase is shifted from that of the first current profile,
    wherein the first current profile is used when the stage is driven and the second current profile is used in a state where the stage stops, and
    wherein a current amount defined by the second current profile is greater than a current amount defined by the first current profile.

7. The charged particle beam apparatus according to claim 1, further comprising:
    a storage section that stores a past history of the thrust force generated in the linear motor mechanism,
    wherein the control section performs a time averaging process of the past history and determines the thrust force generated in the linear motor in the static state of the stage being maintained.

8. The charged particle beam apparatus according to claim 1,
    wherein the control section guesses a time average of the thrust force of the stage that will occur in the future based on a future operating schedule of the stage and determines the thrust force generated in the linear motor in the static state of the stage being maintained based on the guessed result.

9. The charged particle beam apparatus according to claim 1, further comprising:
    a temperature sensor that measures a temperature of the stage,
    wherein the control section determines the current amount flowing through the coil such that the temperature measured by the temperature sensor is within a predetermined target temperature range.

10. The charged particle beam apparatus according to claim 1,
    wherein the control section moves the stage by a non-integer multiple distance of intervals at which the magnets are arranged for each predetermined time.

11. A stage control method in a charged particle beam apparatus including: a stage that holds an object; a linear motor mechanism that is made of a coil and a magnet, and moves the stage by a thrust force generated by a current flowing through the coil; a control section that controls the current flowing through the coil; and a brake that fixes the stage, the stage control method comprising:
    causing the current flowing through the coil in a state where the stage is maintained in the static state to be greater than the minimum current amount required for generating the thrust force greater than the maximum static friction force of the stage with respect to guide rails; and
    providing the coil with the current while applying the brake during a non-operation time of the stage in order to generate the thrust force which is equal to or less than a static friction force of the stage against the guide rails provided by the brake.

12. The stage control method according to claim 11,
    wherein the current is controlled such that the current flows through the coil in a state where the stage is fixed by the brake greater than a current amount flowing through the coil in a state where the stage is operated.

13. The stage control method according to claim 12,
wherein the thrust force generated by the current flowing through the coil in the static state of the stage being maintained is equal to or less than a friction force generated by the brake.

14. The stage control method according to claim 11,
wherein the current flows through the coil by a first current profile in which the current amount flowing through the coil corresponds to position coordinates of the stage, and then the stage is driven, and
wherein the current flows through the coil by a second current profile of which a phase is shifted from that of the first current profile in a state where the stage stops.

15. The stage control method according to claim 11,
wherein a past history of the thrust force generated in the linear motor mechanism is stored,
wherein a time averaging process of the past history is performed and the thrust force generated in the linear motor is determined in the static state of the stage being maintained.

16. The stage control method according to claim 11,
wherein a time average of the thrust force of the stage that will occur in the future is guessed based on a future operating schedule of the stage, and
wherein the thrust force generated in the linear motor in the static state of the stage being maintained is determined based on the guessed result.

17. The stage control method according to claim 11,
wherein the current amount flowing through the coil is determined such that the temperature of the stage is within a predetermined target temperature range.

18. The stage control method according to claim 11,
wherein the stage is moved by a non-integer multiple distance of intervals at which the magnets are arranged for each predetermined time.

* * * * *